(12) United States Patent
Fuller

(10) Patent No.: US 8,844,133 B2
(45) Date of Patent: Sep. 30, 2014

(54) STEREOLITHOGRAPHIC ROCKET MOTOR MANUFACTURING METHOD

(75) Inventor: Jerome K. Fuller, Van Nuys, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 13/555,829

(22) Filed: Jul. 23, 2012

(65) Prior Publication Data

US 2012/0285016 A1 Nov. 15, 2012

Related U.S. Application Data

(63) Continuation of application No. 12/072,717, filed on Feb. 28, 2008, now Pat. No. 8,225,507.

(51) Int. Cl.
| | |
|---|---|
| *F02K 9/14* | (2006.01) |
| *F02K 9/36* | (2006.01) |
| *B29C 67/00* | (2006.01) |
| *G03F 7/00* | (2006.01) |
| *F02K 9/72* | (2006.01) |

(52) U.S. Cl.
CPC ... *F02K 9/72* (2013.01); *F02K 9/14* (2013.01); *F02K 9/36* (2013.01); *B29C 67/0051* (2013.01); *G03F 7/0037* (2013.01)
USPC .......................... 29/890.01; 60/251

(58) Field of Classification Search
CPC ..................................... F02K 9/14; F02K 9/36
USPC .......................... 29/890.01; 60/251
See application file for complete search history.

(56) References Cited

U.S. PATENT DOCUMENTS

| | | |
|---|---|---|
| 2,877,504 A | 3/1959 | Fox |
| 3,136,831 A | 6/1964 | Zinn |
| 3,142,152 A | 7/1964 | Sessums, Jr. |
| 3,144,830 A | 8/1964 | De Fries et al. |
| 3,166,898 A | 1/1965 | Hoeptner |
| 3,177,657 A | 4/1965 | Strauss et al. |
| 3,196,735 A | 7/1965 | Baldwin |
| 3,201,936 A | 8/1965 | Victor |
| 3,242,668 A | 3/1966 | Ellis |
| 3,256,819 A | 6/1966 | Leeper |
| 3,423,943 A | 1/1969 | Stark |

(Continued)

FOREIGN PATENT DOCUMENTS

| | | |
|---|---|---|
| DE | 2024897 B1 | 12/1971 |
| DE | 102005039906 | 3/2007 |

(Continued)

OTHER PUBLICATIONS

Search Report and Written Opinion for International Application No. PCT/US2012/049218 mailed Oct. 30, 2012.

(Continued)

*Primary Examiner* — Peter DungBa Vo
*Assistant Examiner* — Kaying Kue
(74) *Attorney, Agent, or Firm* — Sutherland Asbill & Brennan LLP

(57) ABSTRACT

A hybrid rocket motor is manufactured by photopolymerizing the solid fuel grain in a stereolithography method, wherein fuel grains in a plastic matrix are deposited in layers for building a solid fuel rocket body in three dimensions for improved performance and for a compact design.

19 Claims, 3 Drawing Sheets

PARALLEL RADIAL CHANNEL SOLID FUEL
STEREOLITHOGRAPHIC ROCKET MOTOR

(56) References Cited

U.S. PATENT DOCUMENTS

| | | | |
|---|---|---|---|
| 3,449,600 A | | 6/1969 | Holzman et al. |
| 3,468,125 A | | 9/1969 | Cramer |
| 3,494,286 A | | 2/1970 | Taylor |
| 3,646,597 A | | 2/1972 | Feemster |
| 3,664,133 A | | 5/1972 | Iwanciow et al. |
| 3,677,010 A | * | 7/1972 | Fink et al. .................. 60/220 |
| 3,715,888 A | * | 2/1973 | Massie ........................ 60/251 |
| 3,789,610 A | | 2/1974 | Stone |
| 3,844,118 A | * | 10/1974 | Wilkinson .................. 60/251 |
| 3,995,559 A | * | 12/1976 | Bice et al. ................. 102/284 |
| 4,015,427 A | | 4/1977 | Brooks |
| 4,148,187 A | | 4/1979 | Younkin |
| 4,314,509 A | | 2/1982 | Dalet |
| 4,406,863 A | * | 9/1983 | Jenkins .................... 422/205 |
| 4,458,607 A | * | 7/1984 | Schoeber et al. ............ 110/347 |
| 4,483,139 A | | 11/1984 | Engl |
| 4,510,874 A | * | 4/1985 | Hasenack .................. 110/347 |
| 4,730,601 A | | 3/1988 | Hubele et al. |
| 5,119,627 A | | 6/1992 | Bradford et al. |
| 5,339,625 A | | 8/1994 | McKinney et al. |
| 5,367,872 A | | 11/1994 | Lund |
| 5,386,777 A | | 2/1995 | Lou et al. |
| 5,529,648 A | | 6/1996 | Stickler |
| 5,619,011 A | * | 4/1997 | Dean ........................ 149/19.4 |
| 5,619,073 A | | 4/1997 | Posey et al. |
| 5,623,115 A | | 4/1997 | Lauritzen et al. |
| 5,714,711 A | * | 2/1998 | Schumacher et al. ....... 102/291 |
| 5,715,675 A | | 2/1998 | Smith et al. |
| 5,765,361 A | | 6/1998 | Jones et al. |
| 5,794,435 A | | 8/1998 | Jones |
| 6,014,857 A | | 1/2000 | Stinnesbeck |
| 6,082,097 A | * | 7/2000 | Smith et al. ................. 60/251 |
| 6,092,366 A | * | 7/2000 | Smith et al. ................. 60/251 |
| 6,125,763 A | * | 10/2000 | Kline et al. ................. 102/381 |
| 6,148,610 A | | 11/2000 | Calabro et al. |
| 6,165,307 A | | 12/2000 | Fair et al. |
| 6,311,479 B1 | | 11/2001 | Lo |
| 6,796,171 B2 | | 9/2004 | Heisler et al. |
| 6,865,878 B2 | * | 3/2005 | Knuth et al. ................. 60/258 |
| 6,880,326 B2 | * | 4/2005 | Karabeyoglu et al. ......... 60/251 |
| 7,022,196 B2 | | 4/2006 | Cesaroni et al. |
| 7,955,453 B1 | | 6/2011 | Kelley et al. |
| 8,225,507 B2 | | 7/2012 | Fuller |
| 8,601,790 B2 | * | 12/2013 | Fuller ......................... 60/251 |
| 2002/0028854 A1 | | 3/2002 | Allanic et al. |
| 2002/0036038 A1 | * | 3/2002 | Karabeyoglu et al. ....... 149/19.9 |
| 2002/0062756 A1 | | 5/2002 | Archer |
| 2003/0004599 A1 | | 1/2003 | Herbak |
| 2004/0068976 A1 | * | 4/2004 | Knuth et al. ................. 60/219 |
| 2005/0120703 A1 | | 6/2005 | Rohrbaugh et al. |
| 2006/0005729 A1 | | 1/2006 | Milton et al. |
| 2009/0217525 A1 | * | 9/2009 | Fuller ...................... 29/890.01 |
| 2009/0217642 A1 | * | 9/2009 | Fuller ......................... 60/251 |
| 2010/0281850 A1 | * | 11/2010 | Fuller ......................... 60/253 |
| 2010/0307131 A1 | | 12/2010 | Danforth et al. |
| 2013/0031888 A1 | | 2/2013 | Fuller |
| 2013/0042596 A1 | | 2/2013 | Fuller |
| 2013/0042951 A1 | | 2/2013 | Fuller |

FOREIGN PATENT DOCUMENTS

| | | |
|---|---|---|
| EP | 0426363 A2 | 5/1991 |
| FR | 1315914 A | 1/1963 |
| WO | 96/12610 A2 | 5/1996 |
| WO | 00/05133 A2 | 2/2000 |
| WO | 03/089218 A1 | 10/2003 |
| WO | 2009/145947 | 12/2009 |

OTHER PUBLICATIONS

Dornhaim, M.A., "Ideal Hybrid Fuel is . . . Wax?", Aviation Week and Space Technology, McGraw-Hill Company, New York, NY, vol. 158, No. 5, Feb. 3, 2003, pp. 52-54.

Search Report and Written Opinion for International Application No. PCT/US2012/049185 mailed Feb. 27, 2013.

International Search Report dated Sep. 23, 2009 for International Application No. PCT/US09/35545.

Written Opinion of the International Searching Authority dated Sep. 23, 2009 for International Application No. PCT/US09/35545.

Pham, D.T., Gault, R.S., "A Comparison of Rapid Prototyping Technologies", International Journal of Machine Tools & Manufacture, vol. 38, No. 10-11, 1998, pp. 1257-1287.

Hinkley, D., "A Novel Cold Gas Propulsion System for Nanosatellites and Picosatellites," AIAA/USU Conference on Small Satellites, AIAA, Utah State University, Utah, 2008.

Altman, D., and Holzman, A., "Overview and History of Hybrid Rocket Propulsion," Fundamentals of Hybrid Rocket Combustion and Propulsion, edited by M. J. Chiaverini and K. K. Kuo, Progress in Astronautics and Aeronautics, AIAA, Reston, Virginia, 2007, pp, 1-33.

Boardman, T. A., "Hybrid Propeilant Rockets," Rocket Propulsion Elements, edited by G. P. Sutton and O. Biblarz, Wiley-Interscience, New York, 2001, pp. 579-608.

Altman, D., and Humble, R., "Hybrid Rocket Propulsion Systems," Space Propulsion Analysis and Design, edited by R. W. Humble, G. N. Henry, and W. J. Larson, Space Technology Series, McGraw-Hill Companies, Inc, New York, 1995, pp. 365-443.

Karabeyoglu, M. A., Zilliac, G., Cantwell, B. J., DeZilwa, S., and Castelluci, P. "Scale-Up Tests of High Regression Rate Paraffin-Based Hybrid Rocket Fules" Journal of Propulsion and Power, vol. 20, No. 6, 2004, pp. 1037-1045.

Search Report and Written Opinion for International Application No. PCT/US2012/049153 mailed Oct. 17, 2012.

Search Report for International Application No. PCT/US2012/049153 mailed Oct. 17, 2012.

Written Opinion for International Application No. PCT/US2012/049153 mailed Oct. 17, 2012.

* cited by examiner

UNDULATING RADIAL CHANNEL SOLID FUEL
STEREOLITHOGRAPHIC ROCKET MOTOR

PARALLEL RADIAL CHANNEL SOLID FUEL
STEREOLITHOGRAPHIC ROCKET MOTOR

BURIED RADIAL CHANNEL SOLID FUEL
STEREOLITHOGRAPHIC ROCKET MOTOR

STEREOLITHOGRAPHIC ROCKET MOTOR MANUFACTURING METHOD

REFERENCE TO RELATED APPLICATION

The present application is a continuation of and claims priority under 35 U.S.C. §120 to U.S. patent application Ser. No. 12/072,717, filed on Feb. 28, 2008 now U.S. Pat. No. 8,225,507, titled "Stereolithographic Rocket Motor Manufacturing Method," which is related to co-pending U.S. patent application Ser. No. 12/072,918, filed on Feb. 28, 2008, and titled "Radial Flow Stereolithographic Rocket Motor," and to co-pending U.S. patent application Ser. No. 12/074,001, filed on Feb. 28, 2008, and titled "Buried Radial Flow Stereolithographic Rocket Motor." Each of the forgoing applications are hereby incorporated by reference herein in their entirety.

FIELD OF THE INVENTION

The invention relates to the field of solid fuel hybrid rocket motors. More particularly, the present invention relates to solid fuel hybrid rocket motors having internal radial flows and manufactured using stereolithography.

BACKGROUND OF THE INVENTION

Hybrid motors have recently been given greater attention in the space community. Hybrid rocket motors use reactants of different physical phase states, usually a solid fuel such as rubber and a gaseous oxidizer, such as nitrous oxide. Hybrid motors do not generally deliver the performance of liquid motors. However, hybrid motors are safer and simpler to build and to operate. Hybrid motors can have good performance but often have problems maintaining the proper fuel to oxidizer ratio over the duration of the burn. Hybrid motors disadvantageously also tend to be physically long along the rocket motor axis for the same reasons. Hybrid motors can have complicated systems for introducing the gaseous oxidizer portion at different positions length-wise in the fuel section.

Hybrid solid fuel bodies are generally two-dimensional shapes extruded into the third dimension, for a simple example, a thick-walled tube extruded along the length of the tube. Such a tube is characterized as having a center axial flow channel. The oxidizer is injected through an intake opening and into the solid fuel body and out through a nozzle as exhaust. The fuel is ignited by an igniter positioned proximal to where the oxidizer first contacts the fuel near the intake. The solid fuel bodies generally have a center elongated flow channel through which the oxidizer flows after ignition for ablating the fuel on the side walls of the center elongated flow channel. The fuel is burned on the internal surface effectively ablating the solid fuel interior walls. As the fuel is burned, the combustion becomes oxidizer rich. Oxidizer rich burning provides poor burning efficiency of the solid fuel. Complex fuel grain shapes are sometimes used to increase the amount of surface area in the elongated center flow channel, but sometimes at the risk of an unsupported section of fuel breaking off and plugging the nozzle, causing a catastrophic failure of the hybrid motor. As the fuel burns through the elongated center flow channel, the oxidizer burns the inside of the channel. The growing diameter of the elongated center flow channel changes the ratio between the oxidizer flowing in the channel and the exposed burning fuel on the side walls of the elongated center flow channel. The hybrid rocket motor suffers from changing oxidizer to fuel ratio. The oxidizer to fuel ratio becomes oxidizer rich and thereby wastes available oxidizer that could otherwise be used for more burning of the fuel.

Another problem that is associated with hybrid motors, at least for use in launch vehicles, is low regression rates, typically one third of that of composite solid propellants. Regression rate is the depth-wise rate at which the fuel is removed from the surface where burning occurs. This is a factor in the development of rocket engine thrust. A great amount of research has gone into replacing the solid rocket boosters on the Space Shuttle with hybrid motors only to show that hybrids suffer from low regression rates, which may make replacing large solid motors very difficult. Increased surface area could alleviate this problem.

Stereolithography is a well-known method of building three-dimensional shapes. Stereolithography is generally regarded as a rapid prototyping tool and is typically used to create mock-ups or models for checking the fit, function, and aesthetics of a design. Stereolithography is planar lithographic layering process for building of a three-dimensional solid. Stereolithography uses a platform or substrate that is repeatedly immersed in a photopolymer bath. The exposed photopolymer surface is processed one layer at a time effectively adding many patterned layers upon each other in turn. The light from a moving laser beam exposes and cures the thin two-dimensional layer of photopolymer. With each successive immersion, a new layer of photopolymer is added and a three-dimensional overall shape is eventually made.

There are several rapid prototyping techniques. Stereolithography uses a photopolymer and a curing mechanism. Fused deposition and 3D printing modeling rapid prototyping processes melt plastic and inject the plastic through a moving nozzle or lay down a field of granules, which are selectively bonded together with a binding agent or sintered together with a powerful laser heat source. In all cases, a three-dimensional form is created under computer control by building up two-dimensional layers.

A relatively small cost is required for added design complexity using stereolithography because no dedicated physical tooling is required for this process. For example, a complex buried helical path, for example, can be fabricated, as well as simple straight paths and channels. Many other desired features can be fabricated in the solid using stereolithography, including pitted, rutted, or undulating surfaces made from a plurality of photopolymer layers. The plastic part fabricated using stereolithography have been prototypes unsuitable for space usage.

U.S. Pat. No. 5,367,872, entitled A method and apparatus for enhancing combustion efficiency of solid fuel hybrid rocket motors, issued Nov. 29, 1994 to Lund and Richman, teaches a hybrid rocket motor using a plurality of axially aligned fuel grains having multiple axial perforations. Lund claims a hybrid rocket motor comprising a combustion chamber having aft and forward sections, and a plurality of solid fuel grains. Each grain contains more than one perforation. The fuel grains are cartridge loaded into the combustion chamber along a rocket motor axis such that the perforations of at least two solid fuel grains are misaligned with the perforations of an adjacent solid fuel grain so that the fuel grains are arranged within the combustion chamber to allow gas flow through the perforations in a direction substantially parallel to the rocket motor axis. The individual cartridges can be rotated within a combusted chamber for aligning the perforations. Lund teaches that the flow direction is substantially parallel to the axial elongated center flow channel. Lund teaches that fuel grain cartridges, which are fuel disks having perforated apertures, can be aligned in a combustion chamber. Each fuel grain cartridge has a plurality of aligned perforations through which oxidizer can flow to burn the solid fuel. The perforations are aligned so that the gas flows in all of perforation channels are parallel to each other, substantially in the same axial directly between an intake and exhaust. When all of the flow through the solid fuel is in the same parallel direction, each of the perforations experience like changing of the oxidizer to fuel ratio creating uneven burning.

Existing hybrid rocket motors suffer from oxidizer rich burning, limited parallel axial flow configuration, limited length of the axial channel burning, collapsing of solid rocket bodies, relatively low regression rates and limited extruded channel shapes. These and other disadvantages are solved or reduced using the invention.

SUMMARY OF THE INVENTION

An object of the invention is to provide a hybrid rocket motor made through stereolithography.

Another object of the invention is to provide a hybrid rocket motor having non-axial gas flow.

Yet another object of the invention is to provide a hybrid rocket motor having an undulating channel gas flow.

Still another object of the invention is to provide a hybrid rocket motor having a radial channel gas flow.

A further object of the invention is to provide a hybrid rocket motor having a buried channel gas flow.

Yet a further object of the invention is to provide a hybrid rocket motor having a non-axial gas flow for altering an oxidizer to fuel ratio.

Still a further object of the invention is to provide a hybrid rocket motor having a non-axial gas flow and a fuel core support for supporting the fuel body core during the burning of internal side walls of a fuel body of the hybrid rocket motor.

And another object of the invention is to provide a hybrid rocket motor that is longitudinally compact with the burning in a radial direction.

And another object of the invention is to increase the effective regression rate of a hybrid rocket motor by the incorporation of small voids that increase the surface area available for combustion.

The invention is directed to a hybrid motor including a fuel grain that provides for radial gas flow. The radial gas flow can be used to control the oxidizer to fuel ratio during burning of the rocket fuel. Internal supports made from the fuel can be used to support during burning internal solid fuel cores forming radial channels. Exhaust and intake manifolds and brackets can be used in combination with the internal supports for securing together the rocket motor during a complete burn.

In a first aspect of the invention, the solid fuel body and solid fuel core is created by a manufacturing method by writing a three-dimensional computer model into a stereolithography polymer that is combustible. The polymer includes rubbers and plastics. In some instances, rubber can be used instead of plastic. The plastic part fabricated by stereolithography can be the actual fuel section flight vehicle for use in space. The cured plastic fuel material can be made to be hard and strong. The cured plastic fuel can be burned with an oxidizer to produce thrust for use as part of a rocket motor. A hybrid rocket motor can be manufactured by photopolymerizing the solid fuel in a stereolithography rapid-prototyping type machine. Using stereolithography, fuel grains of any size and shape can be achieved with improved performance in compact designs. Rapid-prototyping stereolithography is used for producing of rocket motor fuel grains, bodies, and cores which can incorporate features that can provide compact packaging and efficient burning. After building of the fuel grain, including the fuel body, fuel core, and fuel supports, manifolds and brackets can then be used to hold the fuel grain together during burning.

In a second aspect of the invention, convoluted burn channels of any shape and length can be formed in the fuel body to allow for greater effective combustion length than the physical length of the motor, and therefore more complete oxidizer consumption. Nonaxial channels are referred to as radial channels. The radial channels have a portion that is not in parallel alignment with a general axial gas channel flow extending along the length of the rocket fuel body. The radial channels can be used to define the amount of initial exposed surface area that changes as the burn proceeds. The use of radial channels provides greater control over the burn profile including the amount burned and the oxidizer to fuel ratio using complex three-dimensional shapes that also allow for stronger fuel bodies to be built. In a third aspect of the invention, buried channels are formed in the rocket body and core. As the oxidizer burns, the fuel from a channel, the channel side walls are ablated as fuel is burned. After some amount of burning, a buried channel is exposed through which burning starts. The use of buried channels allows for the design of different burn profiles as desired. Closed voids, embedded nearly throughout the fuel can increase the overall regression rate and thrust as the burning surfaces expose them.

The stereolithographic hybrid rocket motors with radial channels can be made in complex shapes for controlling the combustion profile. The stereolithographic hybrid rocket motors with radial channels are well suited for use as pico-satellite thrusters, but can be scaled up to larger sizes as desired. Theoretically, special stereolithography machines could be built to fabricate motors of almost any size. These and other advantages will become more apparent from the following detailed description of the preferred embodiment.

DETAILED DESCRIPTION OF THE PREFERRED EMBODIMENT

Figure 1:
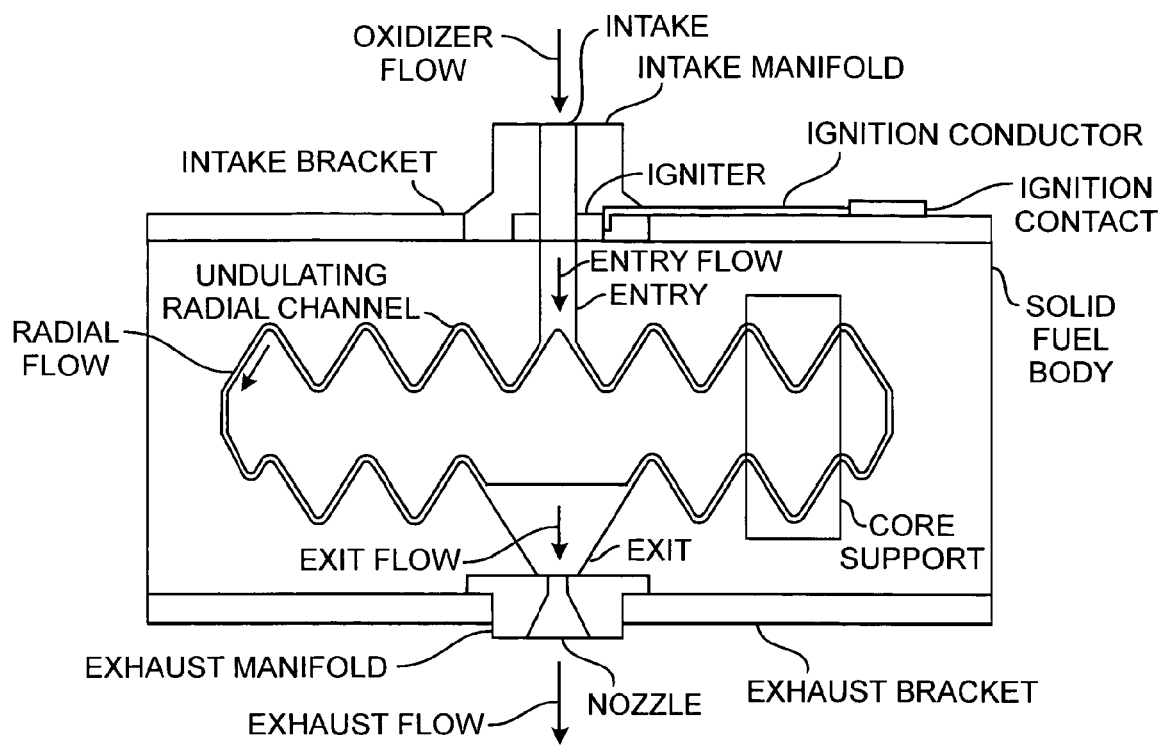
FIG. 1 is a cross section view of an undulating radial channel solid fuel stereolithographic rocket motor.

An embodiment of the invention is described with reference to the figures using reference designations as shown in the figures. Referring to FIG. 1, an undulating radial channel solid fuel rocket motor includes a fuel grain comprising a solid fuel body, a solid fuel core, and optional core support. Preferably, the fuel grain is completely made of a photopolymer comprising fuel disposed using stereolithography. The fuel grain includes an entry having an entry flow and an exit having an exit flow. The entry and exit flows are in axial alignment for axial reference. An intake manifold providing an inlet, includes an intake that is an aperture through which an oxidizer flows designated as an oxidizer flow. The intake may also include multiple apertures to introduce a larger volume of oxidizer without exacerbating the oxidizer to fuel ratio problems that might occur by flowing all of the oxidizer from a single inlet. An exhaust manifold includes a nozzle through which exhaust flows designated as an exhaust flow. Preferably, the oxidizer flow and the exhaust flow are respectively in parallel coincident axial alignment with entry flow and exhaust flow. The gas flow in the fuel grain is constricted to provide multidirectional gas flow within the fuel grain. During stereolithographic manufacture of the fuel grain, the solid fuel core is disposed to form an undulating radial channel through which is at least a portion of radial flow. The gas flow axially enters through the entry and then radial flows around the solid fuel core through the exit in the exit flow. The radial flow is broadly defined as being non-axial flow in reference to the entry flow or the exit flow. An igniter is disposed near the intake for igniting the fuel grain along the inside interior walls of the entry, through the undulating radial channel, and to the exit. An ignition contact can be used to route an ignition current along an ignition conductor to the igniter. An ignition means may consist of several individual igniters, which may be used serially to allow several re-lights of the rocket motor. The igniters are typically disposed near and between the intake and the entry. As shown, the two igniters are disposed in the intake manifold and abut the solid fuel body of the fuel grain. A complete system to this hybrid rocket motor would be structurally similar to other hybrid motor systems. For example, a complete hybrid motor system would include an oxidizer tank, not shown. The system would also include a controller and a valve to control the oxidizer flow on command. The controller would also provide ignition signals on the ignition contact on command.

The method of making the stereolithographic rocket motor includes the steps of repetitively disposing a photopolymeric plastic fuel in layers, exposing each of the layers to photolithograpically curing illumination and removing unexposed portions. The removing step is for defining within the fuel grain, the entry, the exit, the solid fuel body, solid fuel core, and a core support. The removing step also for defining in part a radial channel extending in part between an entry and an exit, so that the flow is multidirectional within the fuel grain. The fuel grain between the entry and exit is then mechanically secured using opposing intake and exhaust brackets. The intake manifold and exhaust manifold are coupled to the brackets. Ignition contact, ignition conductor, and igniters are disposed near the intake aperture. The igniters can be disposed in the fuel grain or in the intake manifold. The igniters preferably abut the fuel grain for efficient ignition of the fuel grain.

In the case of the undulating radial channel solid fuel stereolithographic motor, the solid fuel core resembles a circular disk with undulating outer surfaces mating to undulating inner surfaces of the solid fuel body. The core must be supported to maintain the undulating channel between the core and the solid fuel body. A core support is formed so that the circular disk does not extend a full circle but is rather suspended within a solid fuel body by the core support. The core can be viewed as a simple cylinder extending through the solid fuel core and into the solid fuel body for suspending the core during a burn.

Figure 2:
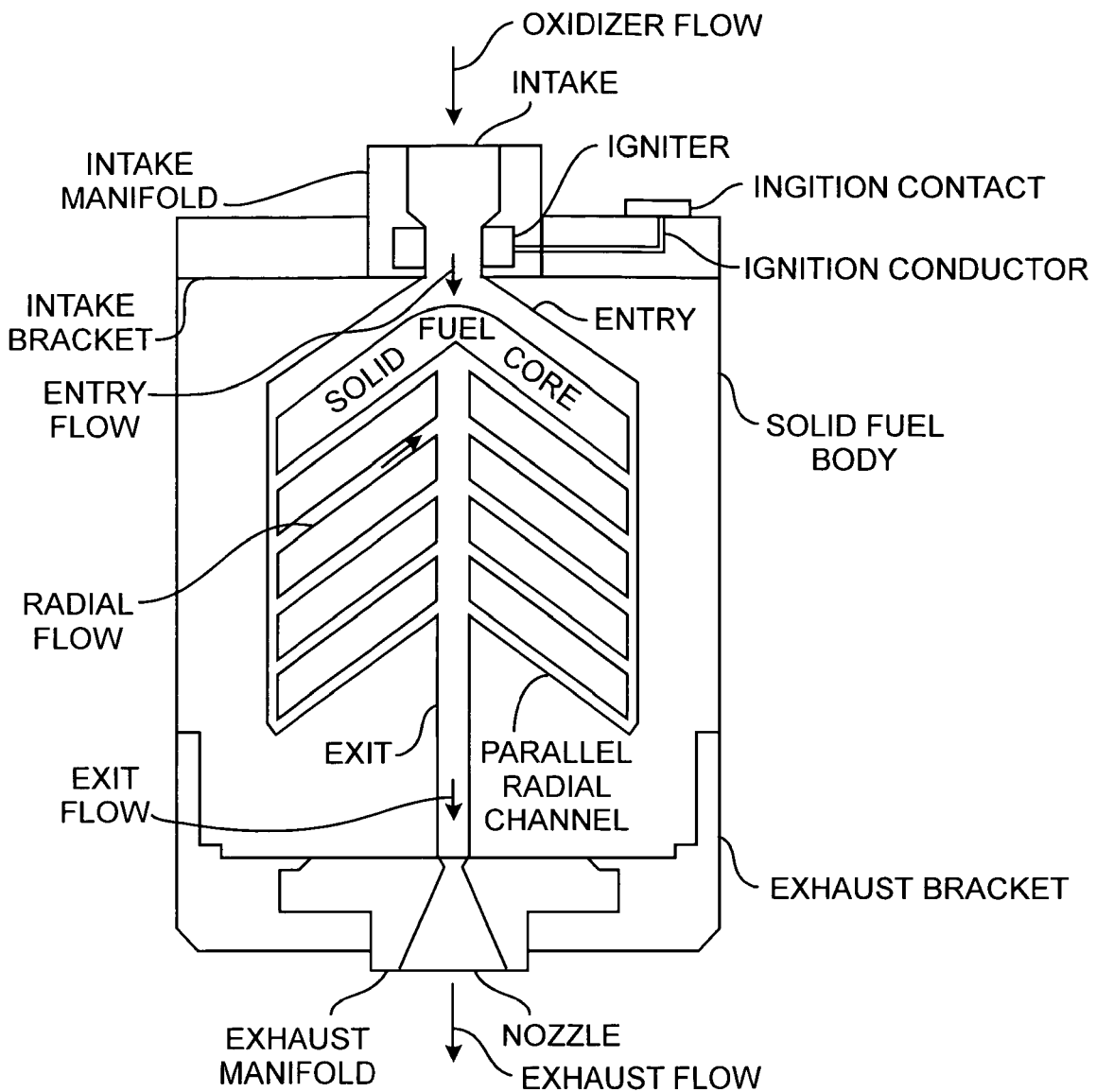
FIG. 2 is a cross section view of a parallel radial channel solid fuel stereolithographic rocket motor.

Referring to FIGS. 1 and 2, and more particularly to FIG. 2, a parallel radial channel solid fuel stereolithographic rocket motor preferably includes a stereolithographically fabricated fuel grain comprising a solid fuel body and a solid fuel core. The fuel grain may include an optional core support, not shown, for supporting the core within the body. Preferably, the fuel grain is stereolithography made of a photopolymer comprising fuel. The fuel grain includes an entry having an entry flow and an exit having an exit flow. As preferably shown, the entry and exit flows are in axial alignment for axial reference. An intake manifold includes an intake that is a cylindrical aperture through which an oxidizer flows as an oxidizer flow. An exhaust manifold includes a nozzle through which exhaust flows as an exhaust flow. Preferably, the oxidizer flow and the exhaust flow are respectively in parallel coincident axial alignment with entry flow and exhaust flow. Gas flow is passed through the parallel radial channels within the fuel grain so as to provide multidirectional gas flow within the fuel grain. In one direction, such as through the entry and exit, gas flows in an axial direction. In another direction, the gas flows radially outward from the entry and radially inward toward the exit. During stereolithographic manufacture of the fuel grain, the solid fuel core is disposed to form the parallel radial channels through which flows at least a portion of the radial flow. The gas flow axially enters through the entry and then radial flows around the solid fuel core through the exit in the exit flow. The radial flow is broadly defined as being non-axial flow in reference to the entry axial flow or the exit axial flow. An igniter is disposed in the intake for igniting the fuel grain alone along the inside interior walls of the entry, and along the undulating radial channel, to the exit. An ignition contact can be used to route an ignition current along an ignition conductor to the igniter. The igniter may consist of several individual igniters, which may be used serially to allow several re-lights of the rocket motor. The igniters are typically disposed near and between the intake and the entry. As shown, the two igniters are disposed in the intake manifold but do not abut the solid fuel body of the fuel grain. The exhaust bracket is shown with an upwardly extending flange for improved securing of the fuel grain.

Figure 3:
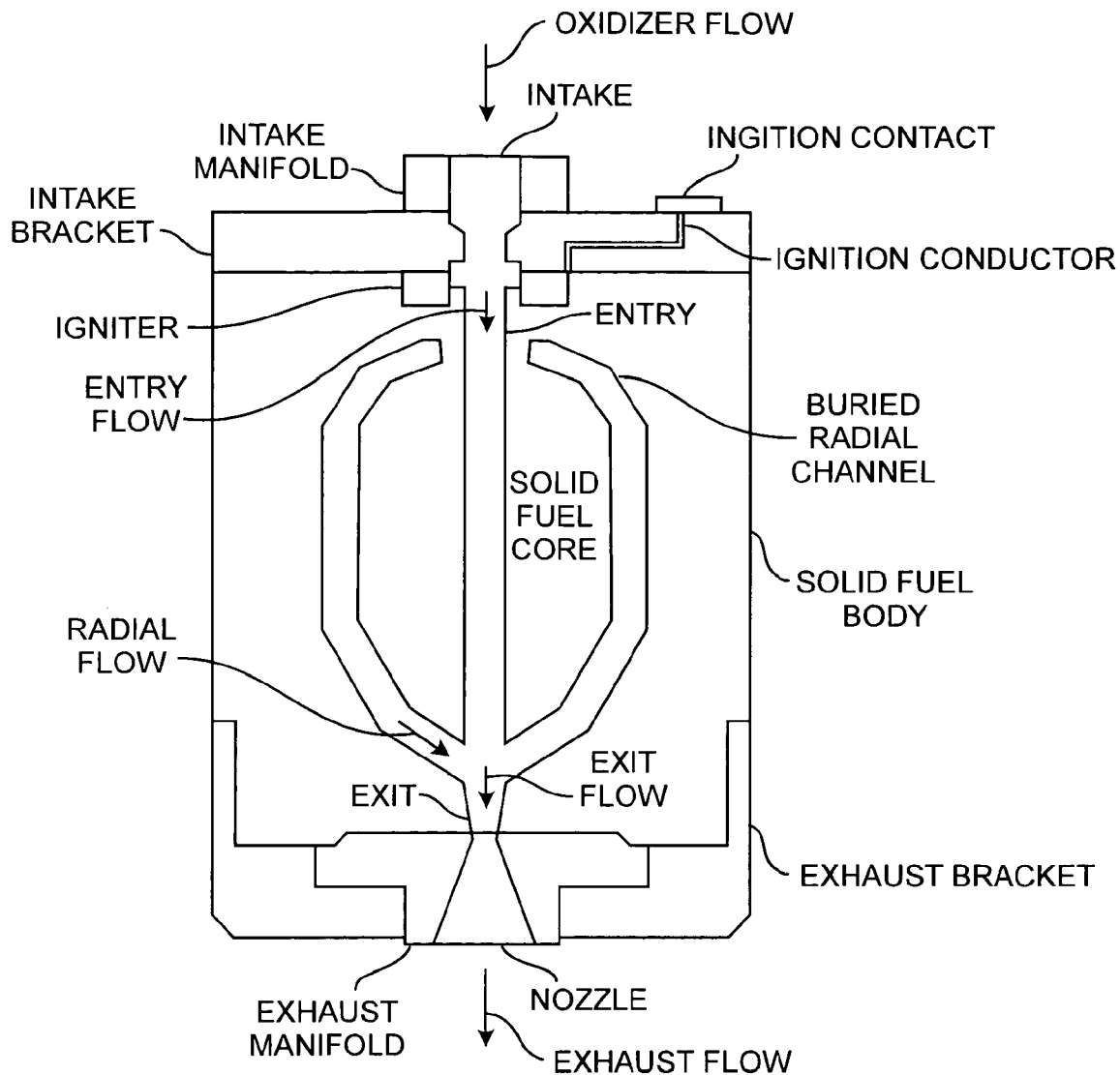
FIG. 3 is a cross section view of a buried radial channel solid fuel stereolithographic rocket motor.

Referring to all of the Figures, and more particularly to FIG. 3, a buried radial channel solid fuel stereolithographic rocket motor preferably includes a stereolithographically fabricated fuel grain comprising a solid fuel body and a solid fuel core. The fuel grain may include an optional core support, not shown, for supporting the core within the body. The fuel grain includes an entry having an entry flow and an exit having an exit flow. As preferably shown, the entry flow and exit flow are in axial alignment for axial reference. An intake manifold includes an intake that is a cylindrical aperture through which an oxidizer flows as an oxidizer flow. An exhaust manifold includes a nozzle through which exhaust flows as an exhaust flow. Preferably, the oxidizer flow and the exhaust flow are respectively in parallel coincident axial alignment with entry flow and exhaust flow. The gas flow in the fuel grain is constricted by buried channels to provide multidirectional gas flow within the fuel grain after an initial burn period. The buried radial channel fuel grain includes an elongated center axial channel extending straight between the entry and the exit. During the initial burn, the side walls of the center channel are burned away. At some point in time, the burning of the side walls exposes the buried radial channel, after which, the gas flow diverges in part into the buried channel between the entry and exit. When gas enters the buried channel, radial flow will start in part through the buried channel. As such, the gas flow is initially in only one axial direction, such as through the entry, straight channel portion, and the exit, where all of the gas flows in the axial direction. In another direction, the gas flows radially outward from the entry and radially inward toward the exit after the buried channel is exposed by the side wall burning of the entry, straight, and exit portions of the main axial channel. During stereolithographic manufacture of the fuel grain, a solid fuel may be disposed to form the radially extending buried channel through which flows at least a portion of radial flow after the initial burn period. The gas flow axially enters through the entry and then radially flows around the solid fuel core through the buried channel in radial flow to the exit in axial exit flow. The radial flow is broadly defined as being non-axial flow in reference to the entry axial flow or the exit axial flow. An igniter is disposed in the fuel grain for igniting the fuel grain alone along the inside interior walls of the entry, buried radial channel, to the exit. An ignition contact can be used to route an ignition current along an ignition conductor to the igniter. The igniter may consist of several individual igniters, which may be used serially to allow several re-lights of the rocket motor. The igniter can be disposed radially about the intake flow for maximum ignition. The igniters are typically disposed near and between the intake and the entry. As shown, the two igniters are disposed in the top of the fuel grain and abut the intake bracket. The exhaust bracket is shown with an upwardly extending flange for improved securing of the fuel grain.

The fuel grain channels are designed to provide physical structure and plumbing of combustion gases. Many new shapes are possible, for example, the fuel grain might have two main chambers of voids, one surrounding the other, separated by fuel. Linking these chambers could be an array of channels, which can be oriented for the best trade-off between good oxidizer mixing and good gas flow. The number, size, and shape of the buried channels would be determined by the surface area and the mechanical strength of the supporting shapes. An igniter section with multiple igniters, conduction lines, and ignition contacts would be incorporated into the end of the fuel grain shape and mounting brackets. An igniter circuit card and nozzle retainer can also be included. On each end, groves for o-ring seals can be designed for improved sealing of combustion gas confined to the axial and radial burn channels. As may now be apparent, the stereolithographic rocket motor ignition section could further include sensing and control electronics. A thin film electronic circuit can be disposed on the brackets or in the fuel grain, though care is needed so that the combustion of the plastic fuel does not destroy the electronic circuit early in a complete burn cycle.

Many variations of the fuel grain are possible. The entry flow and exit flow could have a differential direction of ninety degrees, with the exit flow pointing orthogonal to the entry flow. The fuel grain is made so long as there are internal gas flows is in a plurality of directions through the fuel grain. For example, a radial channel could be made in parallel alignment to an entry flow, both orthogonal to exit flow. The fuel grain may further consist of a solid oxidizer mixed with the liquid photopolymer and cured in the same fashion as the unaltered photopolymer. This partial load of solid oxidizer would not sustain combustion, but may allow hybrid rocket motor operation with a smaller fluid oxidizer tank and at a lower tank pressure. When the fuel grain contains sufficient oxidizer, an external oxidizer tank may not be needed with the motor not even having an intake. Using other rapid prototyping techniques such as laser sintering or 3D printing, small aluminum particles can be added to the medium to produce a more energetic fuel than can be obtained with a polymer alone.

Compact hybrid rocket motors can be made from polymeric fuels using stereolithography manufacturing methods. A solid or hybrid rocket motor would benefit from channel structure manipulation to control the burn profile. Various methods normally used for rapid prototyping can be used to form rocket propellant grains with complex three dimensional structures including internal channel structures.

In Selective Laser Sintering, a field of powder is laid down and a laser selectively melts or sinters the powder particles to form a thin continuous film. Another powder layer is applied and melted on top of the first layer. This is repeated until a 3-D shape is built up. Channels of un-sintered material can be cleared of unincorporated particles to produce the flow channels and ports of the rocket motor fuel grain.

In Fused Deposition Modeling, a bead of molten material is extruded through a nozzle like extrusion head. As the head is moved, a trail of extruded material solidifies behind it. A support material is laid down at the same time so that otherwise unsupported design features can be supported while the shape is built up. The process is repeated with another layer on top of the first and this is repeated until a 3-D object is built up. The support material is removed, usually by dissolving in water, leaving the channels and ports of the rocket motor fuel grain.

In Stereolithography, a film of liquid photopolymer is selectively cured by exposure to light, usually from a laser. After the first layer of photopolymer is cured, the cured layer is submerged and another layer is cured on top of it. Uncured regions are left liquid. These uncured areas define channels and ports of the rocket motor fuel grain as the liquid photopolymer is drained away.

In Laminated Object Manufacturing, a composite structure of adhesive-backed paper or polymer is created by laying down thin sheets or films with a heated roller and cutting them with a laser. The process is repeated, layer upon layer to build up a 3-D structure. Non-part areas are separated from the designed part by laser cutting and then further cut into small pieces which are removed after the part is finished. The areas removed form the channels and ports of the rocket motor fuel grain.

In one form of 3-D Printing, a powder is laid down and a print head, similar to that of an ink-jet printer selectively sprays a fine jet of chemical binder, which cements particles together to make a patterned, contiguous film. Another layer of powder is laid down over this and the binder is sprayed again in another pattern, linking particles of powder together and to the layer below. This process is repeated until a 3-D shape is built up. Channels left in a form where binder was not sprayed can be cleared of unincorporated material to produce the flow channels and ports of the rocket motor fuel grain.

In another form of 3-D Printing, a photopolymer is selectively sprayed from a print head and cured by radiation from a flood lamp. Successive layers are built up to make a 3-D object. Un-printed areas in the model are voids which form the channels and ports of the rocket motor fuel grain.

With these methods, fuel grains can be provided with improved performance in compact designs.

The invention is directed to convoluted paths embedded in fuel grains that provide internal gas flow in a plurality of directions. The convoluted paths allow for a greater effective length than the physical length of the motor, and therefore more complete oxidizer consumption. At the same time, the amount of initial surface area could be grown several folds by introducing truly three-dimensional surface features. The method provides greater control over the burn profile and enables complex three-dimensional shapes that will allow stronger fuel grain sections to be built. A small compact radial channel hybrid motor is well suited for thrusting picosatellites, but can be scaled up to larger sizes to serve more demanding thrust requirements. The hybrid rocket motor could be built to almost any size. Those skilled in the art can make enhancements, improvements, and modifications to the invention, and these enhancements, improvements, and modifications may nonetheless fall within the spirit and scope of the following claims.

The invention claimed is:
1. A method of making a rocket motor, comprising:
   selectively disposing a fuel in a thin layer, portions of the thin layer being selectively patterned, wherein selectively disposing comprises at least one of selectively disposing by laying down using laminated manufactur- ing, selectively disposing by sintering using laser sintering, selectively disposing by extruding using fused deposition modeling, or selectively disposing by printing using spraying; and repeating the selectively disposing step a plurality of times for disposing a plurality of the thin film layers to form a fuel grain of the rocket motor, the patterned layers defining voids in the fuel grain.

2. The method of claim 1, wherein the voids form structures within the fuel grain, the structures comprising at least one buried channel.

3. The method of claim 1, wherein the voids form structures within the fuel grain, the structures channeling gas flow through the fuel grain when the fuel grain is burned when the rocket motor is activated.

4. The method of claim 1, wherein the voids form structures within the fuel grain, the structures channeling gas flow through the fuel grain when the fuel grain is burned when the rocket motor is activated, the gas flowing concurrently axially and radially within the fuel grain.

5. The method of claim 1, wherein the voids form one or more structures within the fuel grain, the one or more structures containing a second solid fuel or liquid fuel.

6. A method of making a solid fuel motor, comprising:
forming a three-dimensional fuel grain utilizing a rapid prototyping technique comprising:
selectively disposing a fuel in a thin layer, portions of the thin layer being selectively patterned; and
repeating the selectively disposing step a plurality of times for disposing a plurality of the thin film layers to form a fuel grain of the rocket motor, the patterned layers defining voids in the fuel grain;
wherein the rapid prototyping technique comprises forming the fuel grain utilizing one of selective laser sintering, fused deposition modeling, three-dimensional printing, or laminated object manufacturing; and
in the fuel grain, at least one of the voids defining at least one channel aligned at least in part axially or radially with respect to a longitudinal axis of the fuel grain.

7. The method of claim 6, wherein defining channels comprises defining at least one buried channel.

8. The method of claim 7, wherein defining at least one buried channel comprises defining at least one buried channel that is not exposed to an initial gas flow within the fuel grain.

9. The method of claim 7, wherein defining at least one buried channel comprises defining at least one buried channel that is configured within the fuel grain to provide a predetermined burn profile of the fuel grain.

10. The method of claim 7, wherein defining at least one buried channel comprises defining at least two buried channels that differ in at least shape or size.

11. The method of claim 6, wherein the fuel grain comprises a solid fuel.

12. The method of claim 6, wherein the fuel grain includes a solid oxidizer.

13. A method of making a rocket motor comprising the steps of:
disposing a fuel by extruding a molten material through an extrusion head in a first patterned layer;
disposing the fuel by extruding the molten material through the extrusion head in a second patterned layer against the first patterned layer;
repeating the disposing steps a plurality of times to generate a plurality of patterned layers; and
removing portions of one or more of the plurality of layers to form a plurality of patterned layers of a fuel grain of the rocket motor, the plurality of patterned layers of the fuel grain defining voids in the fuel grain.

14. The method of claim 13, wherein the structures within the fuel grain comprise a second solid fuel or liquid fuel.

15. The method of claim 13, wherein the structures channel gas flow through the fuel grain when the fuel grain is burned when the rocket motor is activated, the gas flowing concurrently axially and radially within the fuel grain.

16. The method of claim 13, wherein the voids form structures within the fuel gram, the structures comprising at least one buried channel.

17. The method of claim 16, wherein the at least one buried channel comprises at least one buried channel that is not exposed to an initial gas flow within the fuel grain.

18. The method of claim 16, wherein the at least one buried channel comprises at least two buried channels that differ in at least shape or size.

19. The method of claim 13, further comprising laying one or more support materials on the molten material to form the first patterned layer,
wherein removing portions of one or more of the plurality of layers to form a plurality of patterned layers of a fuel grain of the rocket motor comprises removing the one or more support materials.

* * * * *